(12) United States Patent
Nozawa et al.

(10) Patent No.: US 7,868,810 B2
(45) Date of Patent: Jan. 11, 2011

(54) AMPLIFIER CIRCUIT AND A/D CONVERTER

(75) Inventors: Mai Nozawa, Kawasaki (JP); Masanori Furuta, Odawara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/547,973

(22) Filed: Aug. 26, 2009

(65) Prior Publication Data
US 2010/0156683 A1 Jun. 24, 2010

(30) Foreign Application Priority Data
Dec. 22, 2008 (JP) ............................. 2008-325466

(51) Int. Cl.
*H03M 1/38* (2006.01)
(52) U.S. Cl. ....................... 341/161; 330/264
(58) Field of Classification Search .................. 341/161, 341/122, 118; 250/208.1; 327/124; 330/264, 330/9
See application file for complete search history.

(56) References Cited

U.S. PATENT DOCUMENTS

| 5,994,960 | A | 11/1999 | Baschirotto et al. | ......... 330/253 |
| 6,501,400 | B2 * | 12/2002 | Ali | ............................. 341/118 |
| 6,828,856 | B2 * | 12/2004 | Sanchez et al. | ............. 330/253 |
| 6,946,987 | B1 * | 9/2005 | Van Blerkom et al. | ...... 341/161 |
| 7,554,403 | B1 * | 6/2009 | Sakurai | ...................... 330/260 |

FOREIGN PATENT DOCUMENTS

JP 2006-121480 5/2006

OTHER PUBLICATIONS

Ahmed, et al., "*A 50-MS/s (35 mW) to 1-kS/s (15 µW) Power Scaleable 10-bit Pipelined ADC Using Rapid Power-on Opamps and Minimal Bias Current Variation*", IEEE Journal of Solid-State Circuits, Bol. 40, No. 12, Dec. 2005, pp. 2446-2455.

\* cited by examiner

*Primary Examiner*—Brian Young
(74) *Attorney, Agent, or Firm*—Ohlandt, Greeley, Ruggiero & Perle, L.L.P.

(57) ABSTRACT

An amplifier circuit includes a current source that is connected between a power supply voltage and an output node and that is turned on when a switching control signal takes a first value and is turned off when the switching control signal takes a second value; a grounded voltage control current source whose amount of current is controlled by an input voltage; a cascode transistor connected between the voltage control current source and the output node; a boost amplifier connected between a gate electrode and a source electrode of the cascode transistor; and a switch that is connected between an output node of the boost amplifier and a bias voltage and that is turned on for a predetermined period of time when a value of the switching control signal is switched from the second value to the first value, to forcefully rise the boost amplifier.

16 Claims, 6 Drawing Sheets

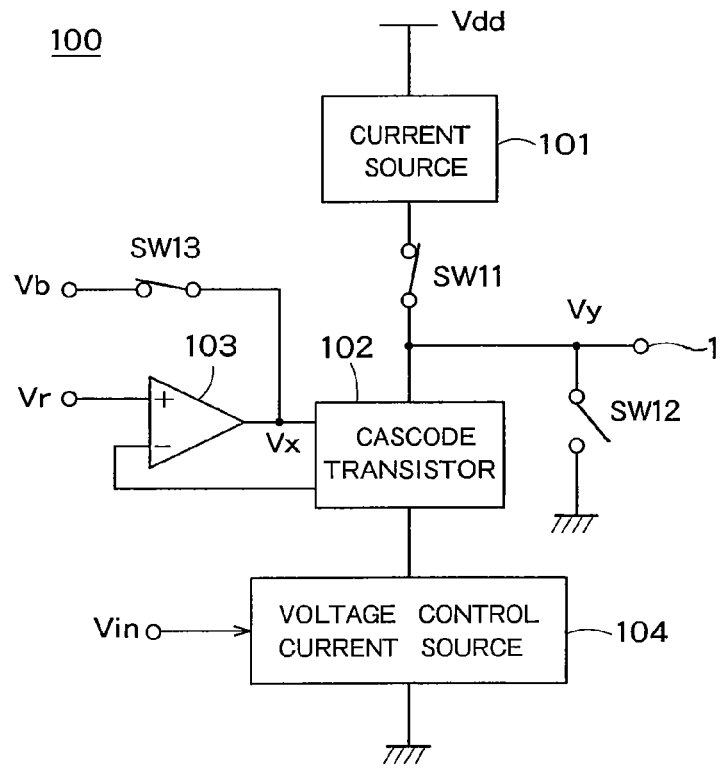
F I G. 1
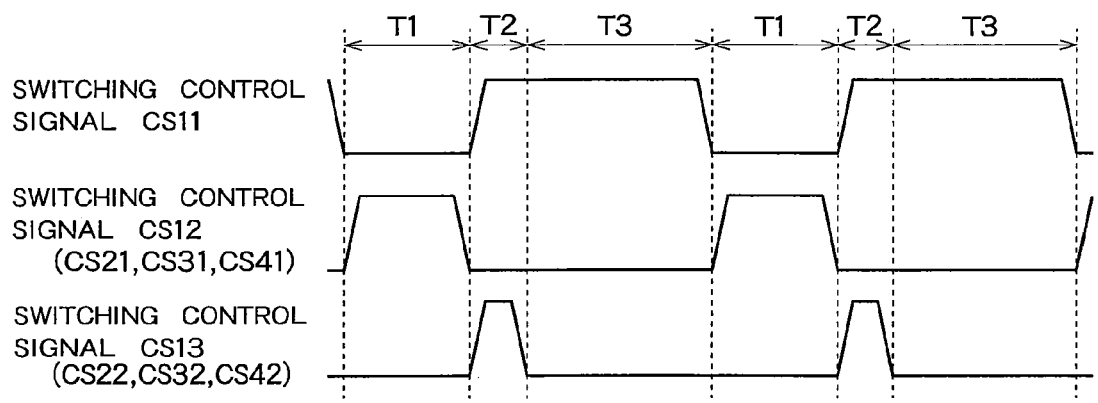
F I G. 2

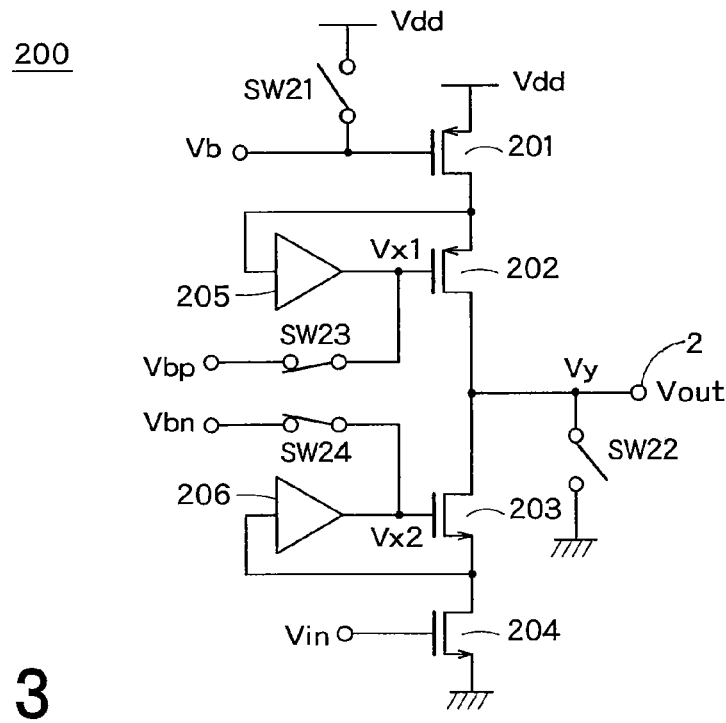
F I G. 3
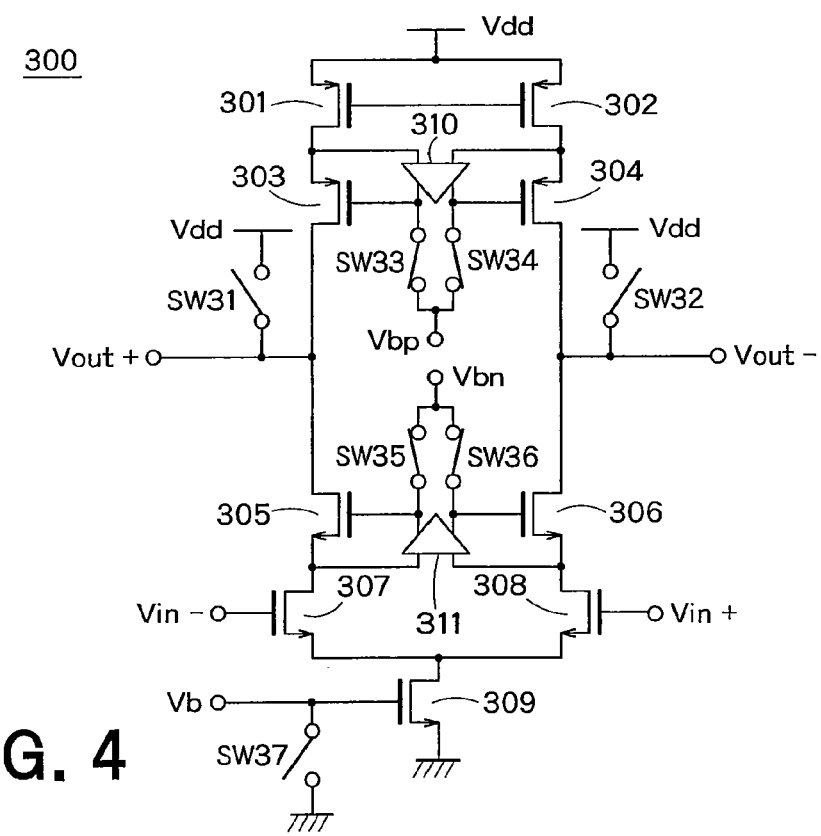
F I G. 4

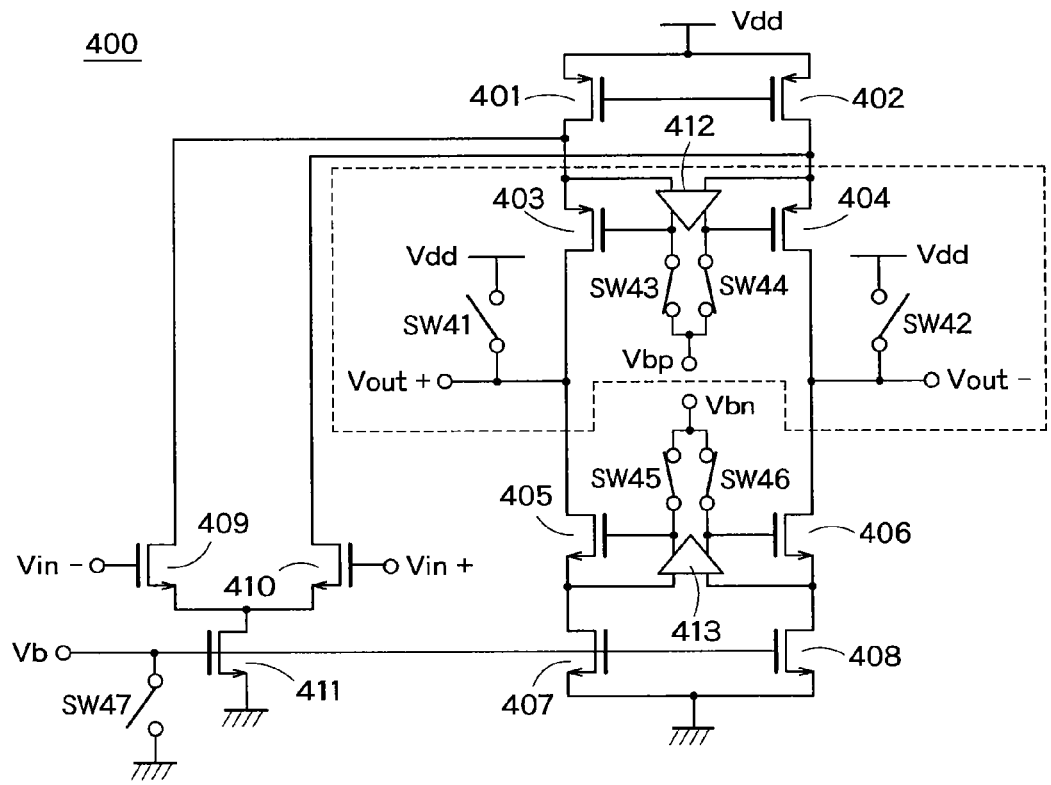
F I G. 5
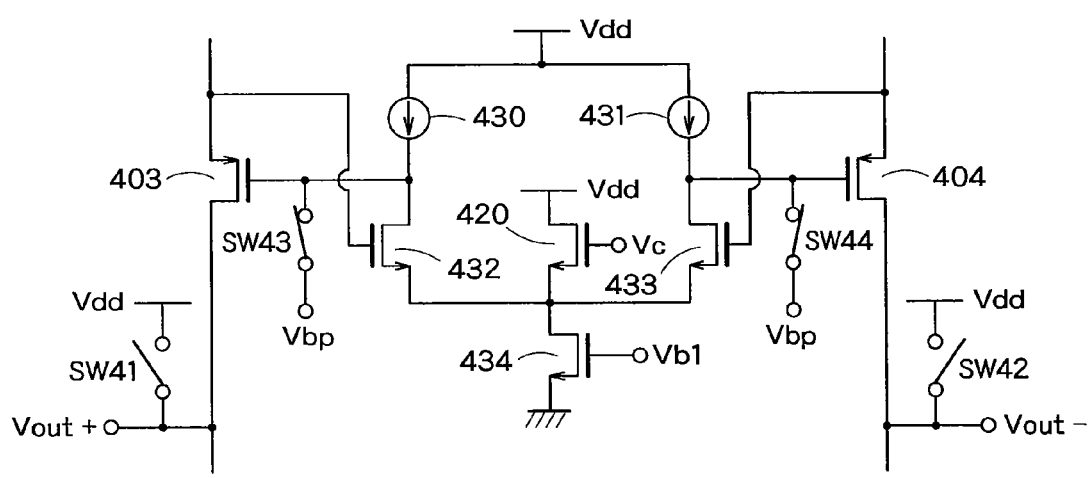
F I G. 6

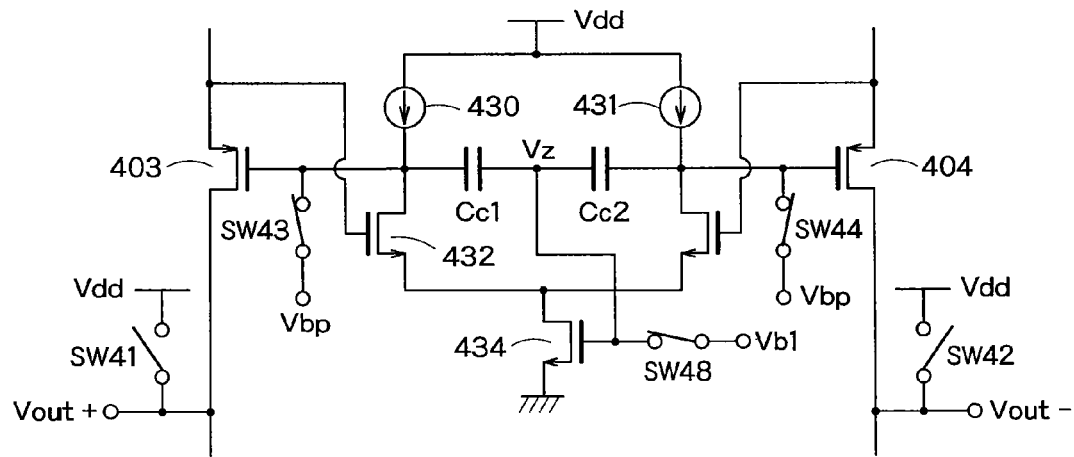
F I G. 7
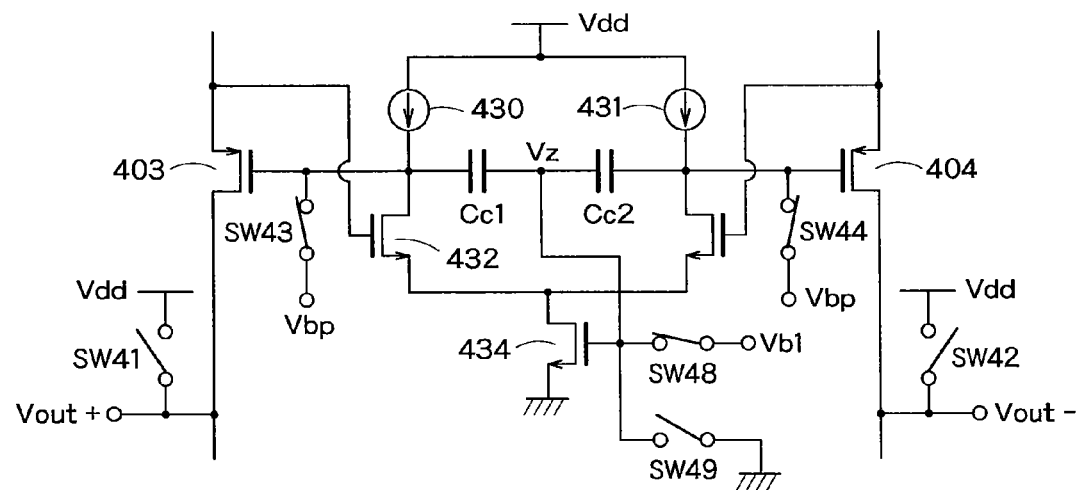
F I G. 8

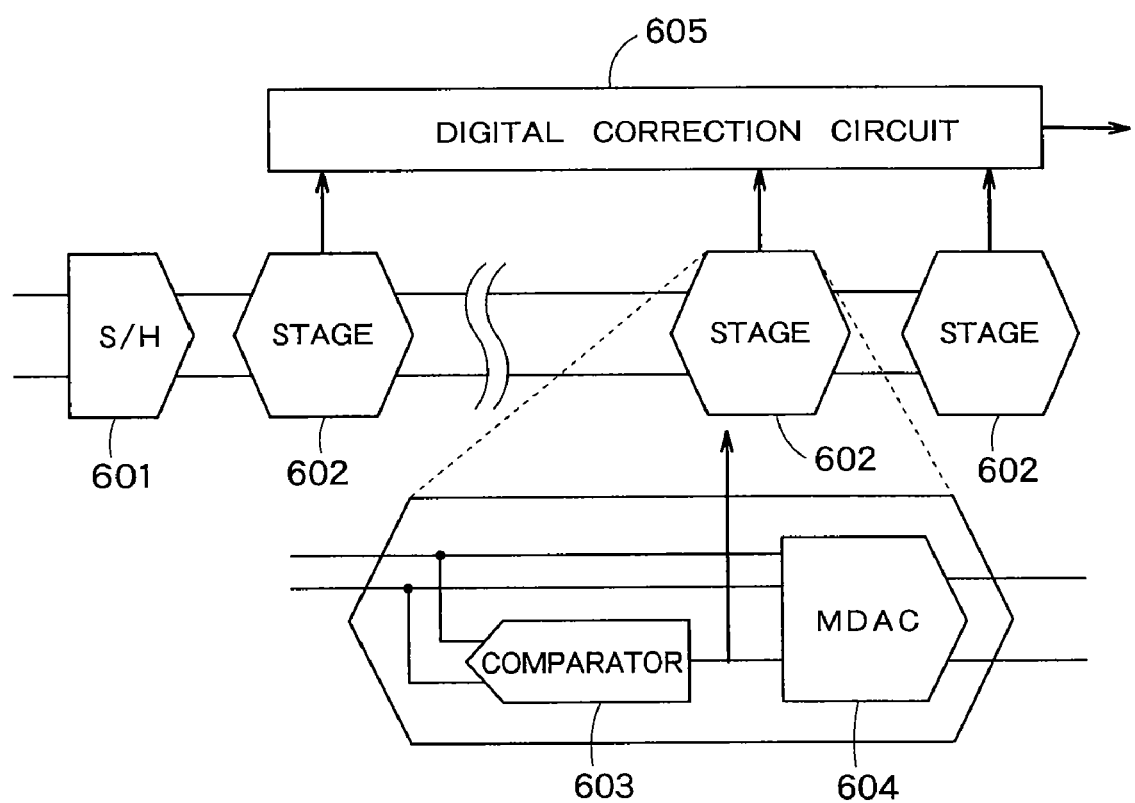
F I G. 11

> US 7,868,810 B2

AMPLIFIER CIRCUIT AND A/D CONVERTER

CROSS REFERENCE TO RELATED APPLICATION

This application is based upon and claims benefit of priority from the Japanese Patent Application No. 2008-325466, filed on Dec. 22, 2008, the entire contents of which are incorporated herein by reference.

BACKGROUND OF THE INVENTION

The present invention relates to an amplifier circuit and an A/D converter.

For a circuit technique for implementing a discrete-time analog signal processing circuit such as a pipeline A/D converter, a variable gain amplifier, etc., a switched capacitor amplifier circuit is known. The switched capacitor amplifier circuit has a capacitor, an amplifier, and a plurality of switches, and samples or holds an input voltage in the capacitor by switching the plurality of switches.

For a technique for reducing the power consumption of such a switched capacitor amplifier circuit, a switched operational amplifier is known. In this technique, of two operating modes (a sample mode and an amplifier mode) of the switched capacitor amplifier circuit, during a sample mode period during which the operational amplifier is not used, the operational amplifier is turned off. Also, there is proposed a switched operational amplifier using, in combination with the above technique, a boost amplifier technique for increasing an open loop gain of the amplifier by increasing the output impedance.

In a switched operational amplifier, when the rise time of the amplifier where the operational amplifier is switched from off to on is long, the period during which the operational amplifier is turned off is reduced and thus a power-saving effect cannot be obtained, causing a problem that an increase in speed cannot be supported.

Normally, on/off switching of the switched operational amplifier is performed by switching a bias voltage to a current source transistor of the amplifier. However, this bias voltage node may be provided with a large decoupling capacitance to keep the bias voltage constant. Therefore, when switching from off to on is performed, the large capacitance needs to be charged, resulting in a long rise time.

In view of this, a technique is proposed in which instead of switching a bias voltage node provided with a large capacitance, by switching the connection of an output node of a boost amplifier with a small parasitic capacitance, the rise time is reduced (see, for example, Imran Ahmed and David A. Johns, "A 50-MS/s (35 mW) to 1-kS/s (15 µW) Power Scaleable 10-bit Pipelined ADC Using Rapid Power-On Opamps and Minimal Bias Current Variation", IEEE Journal of Solid-State Circuits, December 2005, Vol. 40, No. 12).

When such related art is implemented with a low voltage, to ensure a signal amplitude, a large-sized transistor is used for a cascode transistor of a main amplifier. Hence, a large parasitic capacitance is generated between an output node of a boost amplifier and an output node of the main amplifier, resulting in a long activation time of the main amplifier. This is caused because a voltage change at the output node of the main amplifier occurred by an on/off switching operation of the amplifier is transmitted to the output node of the boost amplifier by parasitic capacitance coupling. Therefore, to reduce the activation time using the configuration according to the related art, there is a need to increase the driving capability of the boost amplifier, which causes a problem that a power-saving effect cannot be obtained.

SUMMARY OF THE INVENTION

According to one aspect of the present invention, there is provided an amplifier circuit that amplifies an input signal and outputs the amplified signal from an output node, the amplifier circuit comprising:

a current source that is connected between a first reference voltage line and the output node, and that generates a constant current when a switching control signal takes a first value, and does not generate the constant current when the switching control signal takes a second value;

a voltage control current source which is connected to a second reference voltage line, and whose amount of current is controlled by the input signal;

a cascode transistor that outputs the amplified signal, and that has a drain electrode and a source electrode, the drain electrode being connected to the current source and the output node and the source electrode being connected to the voltage control current source;

a boost amplifier that has an input terminal and an output terminal, the input terminal being connected to the source electrode of the cascode transistor and the output terminal being connected to a gate electrode of the cascode transistor;

a first switch that is connected between the output node and the second reference voltage line, and that is turned off when the switching control signal takes the first value and is turned on when the switching control signal takes the second value; and a second switch that is connected between the output terminal of the boost amplifier and a voltage line having a predetermined voltage, and that is turned on for a predetermined period of time when a value of the switching control signal is switched from the second value to the first value and is turned off after the predetermined period of time has elapsed.

According to one aspect of the present invention, there is provided an amplifier circuit that amplifies differential input signals and outputs the amplified differential signals from a first and a second output node, respectively, the amplifier circuit comprising:

a transistor differential pair having gate electrodes to which the differential input signals are respectively provided;

a first cascode stage that is connected between a first reference voltage line and the first and the second output node, includes a first boost amplifier, and uses conductive transistors that are different from the transistor differential pair;

a second cascode stage that is connected between a second reference voltage line and the first and the second output node, includes a second boost amplifier, and uses conductive transistors that are same as the transistor differential pair;

a current source transistor that is connected between a common source electrode of the transistor differential pair and the second reference voltage line and that is turned on and operates as a current source when a switching control signal takes a first value and is turned off when the switching control signal takes a second value;

a first switch that is connected between the first output node and the first reference voltage line and that is turned off when the switching control signal takes the first value and is turned on when the switching control signal takes the second value;

a second switch that is connected between the second output node and the first reference voltage line and that is turned off when the switching control signal takes the first value and is turned on when the switching control signal takes the second value;

a third switch that is connected between an output terminal of the first boost amplifier and a first voltage line having a first predetermined voltage and that is turned on for a predetermined period of time when a value of the switching control signal is switched from the second value to the first value and is turned off after the predetermined period of time has elapsed; and a fourth switch that is connected between an output terminal of the second boost amplifier and a second voltage line having a second predetermined voltage and that is turned on for a predetermined period of time when the value of the switching control signal is switched from the second value to the first value and is turned off after the predetermined period of time has elapsed.

According to one aspect of the present invention, there is provided an A/D converter comprising the amplifier circuit, wherein the A/D converter has two operation modes including a sample mode and an amplifier mode.

BRIEF DESCRIPTION OF THE DRAWINGS

FIG. 1 is a schematic configuration diagram of an amplifier circuit according to a first embodiment;

FIG. 2 is a timing chart of switching control signals for switches in the amplifier circuit according to the first embodiment;

FIG. 3 is a schematic configuration diagram of an amplifier circuit according to a second embodiment;

FIG. 4 is a schematic configuration diagram of an amplifier circuit according to a third embodiment;

FIG. 5 is a schematic configuration diagram of an amplifier circuit according to a fourth embodiment;

FIG. 6 is a schematic configuration diagram of a boost amplifier in accordance with a modification;

FIG. 7 is a schematic configuration diagram of a boost amplifier in accordance with a modification;

FIG. 8 is a schematic configuration diagram of a boost amplifier in accordance with a modification;

FIG. 11 is a schematic configuration diagram of an A/D converter according to a sixth embodiment.

DESCRIPTION OF THE EMBODIMENTS

Figure 9:
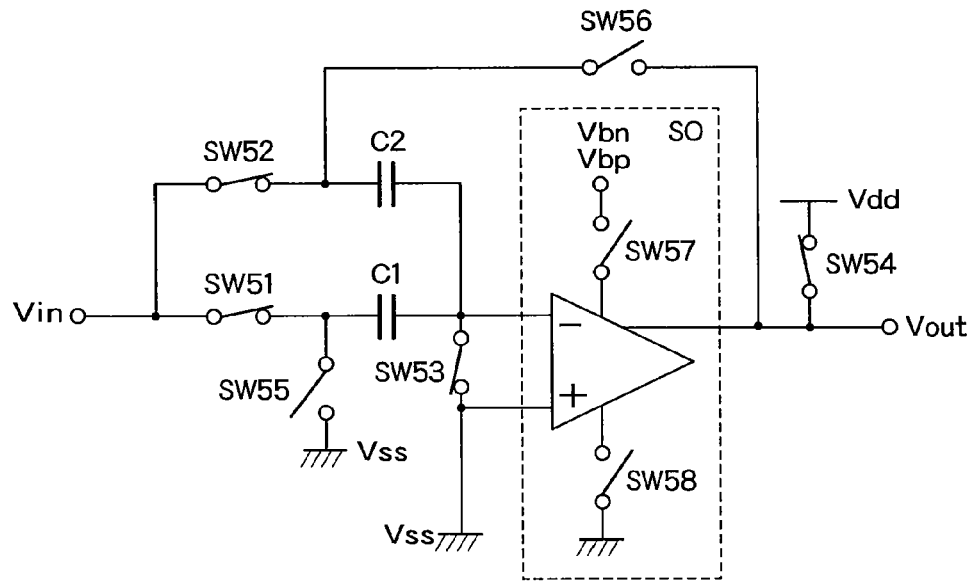
FIG. 9 is a schematic configuration diagram of an amplifier circuit according to a fifth embodiment.

Embodiments of the present invention will be described below based on the drawings.

First Embodiment

A schematic configuration of an amplifier circuit according to a first embodiment of the present invention is shown in FIG. 1. An amplifier circuit 100 includes a current source 101, a cascode transistor 102, a boost amplifier 103, a voltage control current source 104, and switches SW11 to SW13. A power supply voltage Vdd is provided to the current source 101, whereby a constant current is generated. The switch SW11 switches whether to supply the current generated by the current source 101 to the cascode transistor 102. The switch SW11 is on/off controlled by a switching control signal CS11.

An output terminal 1 of the amplifier circuit 100 is connected to a drain electrode (not shown) of the cascode transistor 102. Also, the output terminal 1 is grounded through the switch SW12. The switch SW12 is on/off controlled by a switching control signal CS12. The switching control signal CS12 takes a value obtained by inverting the switching control signal CS11.

When the amplifier circuit 100 is turned on, the switching control signal CS11 is at a high level and the switching control signal CS12 is at a low level and accordingly the switch SW11 is turned on and the switch SW12 is turned off. When the amplifier circuit 100 is turned off, the switching control signal CS11 is at a low level and the switching control signal CS12 is at a high level and accordingly the switch SW11 is turned off and the switch SW12 is turned on.

The boost amplifier 103 increases the output impedance of the amplifier circuit 100. An inverted input terminal and an output terminal of the boost amplifier 103 are respectively connected to a source electrode and a gate electrode (both of which are not shown) of the cascode transistor 102. A predetermined voltage Vr is input to a non-inverted input terminal of the boost amplifier 103.

A bias voltage Vb is supplied to the output terminal (output node Vx) of the boost amplifier 103 through the switch SW13. The switch SW13 is on/off controlled by a switching control signal CS13 and is turned on for a predetermined period of time when the amplifier circuit 100 is turned on (rises).

An input voltage Vin is supplied to the voltage control current source 104 and the amount of current flowing is controlled by the input voltage Vin.

The operation of such an amplifier circuit 100 will be described using a timing chart of the switching control signals CS11 to CS13 shown in FIG. 2. Note that the switching control signals CS11 to CS13 are generated by a peripheral circuit or the like (not shown).

During a period T1, the switching control signal CS11 is at a low level, i.e., the switch SW11 is turned off, and accordingly the amplifier circuit 100 is turned off. Also, at this time, the switching control signal CS12 is at a high level, i.e., the switch SW12 is turned on, and accordingly an output node Vy of the amplifier circuit 100 is grounded.

During a period T2, the switching control signal CS11 rises and goes to a high level and accordingly the switch SW11 is turned on and the amplifier circuit 100 is turned on. The switching control signal CS12 goes to a low level, i.e., the switch SW12 is turned off, and accordingly the output node Vy is separated from the ground potential. Also, the switching control signal CS13 rises and goes to a high level and accordingly the switch SW13 is turned on.

When the switch SW13 is turned on, the output node Vx of the boost amplifier 103 is connected to the bias voltage Vb. By this, the boost amplifier 103 is forcefully caused to rise and thus the activation time is reduced. In addition, the amplifier circuit 100 is prevented from being affected by parasitic capacitance coupling between the output node Vy and the output node Vx. Moreover, even when the boost amplifier 103 has not completely risen, the amplifier circuit 100 starts its operation and thus the overall activation time of the amplifier circuit 100 can be reduced.

The bias voltage Vb may be any potential as long as the potential allows a transistor in the boost amplifier 103 to operate in a saturation range. It is more preferred that the bias voltage Vb be a potential near the operating point of the boost amplifier 103.

During a period T3, the switching control signal CS13 goes to a low level and accordingly the switch SW13 is turned off and the output node Vx is separated from the bias voltage Vb.

By this, the boost amplifier 103 can increase the output impedance of the amplifier circuit 100 (cascode transistor 102).

In the amplifier circuit 100, such periods T1 to T3 are repeated. Note that during the period T2 the boost amplifier 103 does not serve to increase the output impedance of the amplifier circuit 100 but, for example, when the amplifier circuit 100 is included in a switched capacitor amplifier circuit, the operation performed during the period T2 may be performed during a sample mode period (the period during which the amplifier is not used). That is, the periods T1 and T2 serve as a sample mode period of the switched capacitor amplifier circuit and the period T3 serves as an amplifier mode period.

As such, by applying a bias voltage Vb to the output node of the boost amplifier 103 upon rising the amplifier circuit 100, to forcefully rise the boost amplifier 103, the activation time of the amplifier circuit 100 can be reduced. In addition, since there is no need to increase the driving capability of the boost amplifier, an increase in power consumption can be suppressed.

Note that a bias voltage Vb can be easily generated by a part of a bias circuit used in a peripheral circuit, etc., e.g., a current mirror circuit. Therefore, a bias voltage Vb can be obtained without increasing circuit size or power consumption.

Although in the present embodiment, as shown in FIG. 1, the cascode transistor 102 is provided on the ground side as viewed from the output, a reversed polarity version of the cascode transistor 102 may be provided on the power supply voltage Vdd side.

Also, instead of an input voltage Vin, a bias voltage generated by a peripheral circuit or the like may be provided to the voltage control current source 104.

Second Embodiment

A schematic configuration of an amplifier circuit 200 according to a second embodiment of the present invention is shown in FIG. 3. Although in the first embodiment an amplifier circuit is configured using a cascode transistor with only one polarity, the amplifier circuit 200 according to the present embodiment uses a P-ch cascode transistor 202 and an N-ch cascode transistor 203 in combination.

The amplifier circuit 200 includes a transistor (P-ch transistor) 201, the P-ch cascode transistor 202, the N-ch cascode transistor 203, a transistor (N-ch transistor) 204, boost amplifiers 205 and 206, and switches SW21 to SW24.

A source electrode of the transistor 201 is connected to a power supply voltage Vdd and a bias voltage Vb is provided to a gate electrode of the transistor 201. The bias voltage Vb is a voltage that can turn on the transistor 201. Also, the gate electrode of the transistor 201 is connected to a power supply voltage Vdd through the switch SW21. The switch SW21 is on/off controlled by a switching control signal CS21.

An input of the boost amplifier 205 is connected to a connection point between a drain electrode of the transistor 201 and a source electrode of the P-ch cascode transistor 202. A gate electrode of the P-ch cascode transistor 202 is connected to an output of the boost amplifier 205. An output node Vx1 of the boost amplifier 205 is connected to a bias voltage Vbp through the switch SW23. The switch SW23 is on/off controlled by a switching control signal CS22.

An output terminal 2 of the amplifier circuit 200 is connected to a connection point between a drain electrode of the P-ch cascode transistor 202 and a drain electrode of the N-ch cascode transistor 203. An output node Vy of the amplifier circuit 200 is connected to a ground potential through the switch SW22. The switch SW22 is on/off controlled by the switching control signal CS21, as with the switch SW21.

A gate electrode of the N-ch cascode transistor 203 is connected to an output of the boost amplifier 206. An output node Vx2 of the boost amplifier 206 is connected to a bias voltage Vbn through the switch SW24. The switch SW24 is on/off controlled by the switching control signal CS22, as with the switch SW23.

An input of the boost amplifier 206 is connected to a connection point between a drain electrode of the transistor 204 and a source electrode of the N-ch cascode transistor 203. An input voltage Vin is provided to a gate electrode of the transistor 204. A source electrode of the transistor 204 is grounded.

Next, the operation of the amplifier circuit 200 will be described. Note that since a timing chart of the switching control signals CS21 and CS22 is the same as that of the switching control signals CS12 and CS13 in the first embodiment shown in FIG. 2, description will be made using FIG. 2.

During a period T1, the switching control signal CS21 is at a high level and accordingly the switch SW21 is turned on and the transistor 201 is turned off. Thus, the amplifier circuit 200 is turned off. At this time, the switch SW22 is turned on and the output node Vy is connected to a ground potential. Also, at this time, the switching control signal CS22 is at a low level and accordingly the switches SW23 and SW24 are turned off.

During a period T2, the switching control signal CS21 goes to a low level and accordingly the switch SW21 is turned off and the transistor 201 is turned on and operates as a current source. By this, the amplifier circuit 200 is turned on. At this time, the switch SW22 is turned off and thus the output node Vy is separated from the ground potential.

The switching control signal CS22 rises and goes to a high level and accordingly the switches SW23 and SW24 are turned on. When the switch SW23 is turned on, the output node Vx1 of the boost amplifier 205 is connected to the bias voltage Vbp, whereby the boost amplifier 205 is forcefully caused to rise. Likewise, when the switch SW24 is turned on, the output node Vx2 of the boost amplifier 206 is connected to the bias voltage Vbn, whereby the boost amplifier 206 is forcefully caused to rise.

Accordingly, the activation times of the boost amplifiers 205 and 206 are reduced. In addition, even when the boost amplifiers 205 and 206 have not completely risen, the amplifier circuit 200 starts its operation and thus the overall activation time of the amplifier circuit 200 can be reduced.

During a period T3, the switching control signal CS22 falls and goes to a low level. By this, in the boost amplifiers 205 and 206, the output nodes Vx1 and Vx2 are separated from the bias voltages Vbp and Vbn, respectively, increasing the output impedance of the amplifier circuit 200.

As such, in the case of using bipolar cascode transistors, too, by applying a bias voltage to output nodes of boost amplifiers for a predetermined period of time upon activating an amplifier circuit, to forcefully rise the boost amplifiers, the activation time can be reduced. Accordingly, as with the first embodiment, in the amplifier circuit according to the present embodiment, too, by reducing the activation time to obtain a longer off-time, an increase in power consumption can be suppressed.

In the second embodiment, it is preferred that the bias voltage Vbp be a potential near the operating point of the boost amplifier 205. Also, it is preferred that the bias voltage Vbn be a potential near the operating point of the boost amplifier 206.

Third Embodiment

A schematic configuration of an amplifier circuit 300 according to a third embodiment of the present invention is shown in FIG. 4. While the amplifier circuit 200 according to the second embodiment shown in FIG. 3 has a single-phase configuration, the amplifier circuit 300 according to the present embodiment has a differential configuration. Here, a telescopic type is used.

The amplifier circuit 300 includes P-ch transistors 301 to 304, N-ch transistors 305 to 309, boost amplifiers 310 and 311, and switches SW31 to SW37. The switches SW31, SW32, and SW37 are on/off controlled by a switching control signal CS31. The switches SW33 to SW36 are on/off controlled by a switching control signal CS32.

Differential input signals Vin– and Vin+ are respectively input to gate electrodes of the transistors 307 and 308 which configure a differential pair. Amplified differential signals Vout+ and Vout– are respectively output from drain electrodes of a pair of the cascode-connected transistors 305 and 306. Output nodes of the amplifier circuit 300 are connected to a power supply voltage Vdd through the switches SW31 and SW32, respectively.

Two output terminals of the boost amplifier 310 are respectively connected to gate electrodes of a pair of the cascode-connected transistors 303 and 304 and two input terminals of the boost amplifier 310 are respectively connected to source electrodes of the transistors 303 and 304 (drain electrodes of a pair of the cascode-connected transistors 301 and 302). Output nodes of the boost amplifiers 310 are connected to a bias voltage Vbp through the switches SW33 and SW34, respectively.

Two output terminals of the boost amplifier 311 are respectively connected to gate electrodes of the transistors 305 and 306 and two input terminals of the boost amplifier 311 are respectively connected to source electrodes of the transistors 305 and 306. Output nodes of the boost amplifiers 311 are connected to a bias voltage Vbn through the switches SW35 and SW36, respectively.

As such, the boost amplifier 310 is shared between the transistors 303 and 304. The boost amplifier 311 is shared between the transistors 305 and 306.

Gate electrodes of the transistors 301 and 302 are connected to each other and the drain electrodes of the transistors 301 and 302 are respectively connected to the source electrodes of the transistors 303 and 304. A common source electrode of the transistors 301 and 302 is connected to a power supply voltage Vdd.

A drain electrode of the transistor 309 is connected to a common source electrode of the transistors 307 and 308 and a source electrode of the transistor 309 is connected to a ground potential. A bias voltage Vb of a level that can turn on the transistor 309 is applied to a gate electrode of the transistor 309. Also, the gate electrode of the transistor 309 is connected to a ground potential through the switch SW37. The transistor 309 serves as a current source.

The bias voltages Vbn, Vbp, and Vb and the switching control signals CS31 and CS32 are generated by a peripheral circuit or the like.

A timing chart of the switching control signals CS31 and CS32 is the same as that of the switching control signals CS12 and CS13 in the first embodiment shown in FIG. 2 and thus the operation of the amplifier circuit 300 will be described using FIG. 2.

During a period T1, the switching control signal CS31 is at a high level and accordingly the switch SW37 is turned on and the transistor 309 is turned off. Thus, the amplifier circuit 300 is turned off. At this time, the switches SW31 and SW32 are turned on and the output nodes of the amplifier circuit 300 are connected to the power supply voltage Vdd. Also, at this time, the switching control signal CS32 is at a low level and accordingly the switches SW33 to SW36 are turned off.

During a period T2, the switching control signal CS31 goes to a low level and accordingly the switch SW37 is turned off and the transistor 309 is turned on and operates as a current source. By this, the amplifier circuit 300 is turned on. At this time, the switches SW31 and SW32 are turned off and thus the output nodes are separated from the power supply voltage Vdd.

The switching control signal CS32 rises and goes to a high level and accordingly the switches SW33 to SW36 are turned on. When the switches SW33 and SW34 are turned on, the output nodes of the boost amplifier 310 are connected to the bias voltage Vbp, whereby the boost amplifier 310 is forcefully caused to rise. Likewise, when the switches SW35 and SW36 are turned on, the output nodes of the boost amplifier 311 are connected to the bias voltage Vbn, whereby the boost amplifier 311 is forcefully caused to rise.

Accordingly, the activation times of the boost amplifiers 310 and 311 are reduced. In addition, even when the boost amplifiers 310 and 311 have not completely risen, the amplifier circuit 300 starts its operation and thus the overall activation time of the amplifier circuit 300 can be reduced.

During a period T3, the switching control signal CS32 falls and goes to a low level. By this, in the boost amplifiers 310 and 311, their respective output nodes are separated from the bias voltages Vbp and Vbn, increasing the output impedance of the amplifier circuit 300.

As such, in the case of a differential configuration, too, by applying a bias voltage to output nodes of boost amplifiers for a predetermined period of time upon activating an amplifier circuit, to forcefully rise the boost amplifiers, the activation time can be reduced. Accordingly, in the amplifier circuit according to the present embodiment, too, by the reduction in activation time, a longer off-time is obtained and accordingly an increase in power consumption can be suppressed.

Fourth Embodiment

A schematic configuration of an amplifier circuit 400 according to a fourth embodiment of the present invention is shown in FIG. 5. The amplifier circuit 400 is of a folded-cascode type.

The amplifier circuit 400 includes P-ch transistors 401 to 404, N-ch transistors 405 to 411, boost amplifiers 412 and 413, and switches SW41 to SW47.

The switches SW41, SW42, and SW47 are on/off controlled by a switching control signal CS41. The switches SW43 to SW46 are on/off controlled by a switching control signal CS42.

Differential input signals Vin– and Vin+ are respectively input to gate electrodes of the transistors 409 and 410 which configure a differential pair. Amplified differential signals Vout+ and Vout– are respectively output from drain electrodes of a pair of the cascode-connected transistors 405 and 406. Output nodes of the amplifier circuit 400 are connected to a power supply voltage Vdd through the switches SW41 and SW42, respectively.

Two output terminals of the boost amplifier 412 are respectively connected to gate electrodes of a pair of the cascode-connected transistors 403 and 404 (drain electrodes of a pair of the cascode-connected transistors 401 and 402) and two input terminals of the boost amplifier 412 are respectively connected to source electrodes of the transistors 403 and 404.

Output nodes of the boost amplifier 412 are connected to a bias voltage Vbp through the switches SW43 and SW44, respectively.

Two output terminals of the boost amplifier 413 are respectively connected to gate electrodes of the transistors 405 and 406 and two input terminals of the boost amplifier 413 are respectively connected to source electrodes of the transistors 405 and 406 (drain electrodes of a pair of the cascode-connected transistors 407 and 408). Output nodes of the boost amplifier 413 are connected to a bias voltage Vbn through the switches SW45 and SW46, respectively.

As such, the boost amplifier 412 is shared between the transistors 403 and 404. The boost amplifier 413 is shared between the transistors 405 and 406.

Gate electrodes of the transistors 401 and 402 are connected to each other and the drain electrodes of the transistors 401 and 402 are respectively connected to the source electrodes of the transistors 403 and 404 and drain electrodes of the transistors 409 and 410. A common source electrode of the transistors 401 and 402 is connected to a power supply voltage Vdd.

A drain electrode of the transistor 411 is connected to a common source electrode of the transistors 409 and 410 and a source electrode of the transistor 411 is grounded. A bias voltage Vb of a level that can turn on the transistors 407, 408, and 411 is applied to gate electrodes of the transistors 407, 408, and 411. Also, the gate electrodes of the transistors 407, 408, and 411 are connected to a ground potential through the switch SW47. The transistors 407, 408, and 411 serve as current sources.

The drain electrodes of the transistors 407 and 408 are connected to the source electrodes of the transistors 405 and 406. A common source electrode of the transistors 407 and 408 is grounded.

The bias voltages Vbn, Vbp, and Vb and the switching control signals CS41 and CS42 are generated by a peripheral circuit or the like.

A timing chart of the switching control signals CS41 and CS42 is the same as that of the switching control signals CS12 and CS13 in the first embodiment shown in FIG. 2 and thus the operation of the amplifier circuit 400 will be described using FIG. 2.

During a period T1, the switching control signal CS41 is at a high level and accordingly the switch SW47 is turned on and the transistors 407, 408, and 411 are turned off. Thus, the amplifier circuit 400 is turned off. At this time, the switches SW41 and SW42 are turned on and the output nodes of the amplifier circuit 400 are connected to the power supply voltage Vdd. Also, at this time, the switching control signal CS42 is at a low level and accordingly the switches SW43 to SW46 are turned off.

During a period T2, the switching control signal CS41 goes to a low level and accordingly the switch SW47 is turned off and the transistors 407, 408, and 411 are turned on and operate as current sources. By this, the amplifier circuit 400 is turned on. At this time, the switches SW41 and SW42 are turned off and thus the output nodes are separated from the power supply voltage Vdd.

The switching control signal CS42 rises and goes to a high level and accordingly the switches SW43 to SW46 are turned on. When the switches SW43 and SW44 are turned on, the output nodes of the boost amplifier 412 are connected to the bias voltage Vbp, whereby the boost amplifier 412 is forcefully caused to rise. Likewise, when the switches SW45 and SW46 are turned on, the output nodes of the boost amplifier 413 are connected to the bias voltage Vbn, whereby the boost amplifier 413 is forcefully caused to rise.

Accordingly, the activation times of the boost amplifiers 412 and 413 are reduced. In addition, even when the boost amplifiers 412 and 413 have not completely risen, the amplifier circuit 400 starts its operation and thus the overall activation time of the amplifier circuit 400 can be reduced.

During a period T3, the switching control signal CS42 falls and goes to a low level. By this, in the boost amplifiers 412 and 413, their respective output nodes are separated from the bias voltages Vbp and Vbn, increasing the output impedance of the amplifier circuit 400.

As such, as with the third embodiment, by applying a bias voltage to output nodes of boost amplifiers for a predetermined period of time upon activating an amplifier circuit, to forcefully rise the boost amplifiers, the activation time can be reduced. Accordingly, in the amplifier circuit according to the present embodiment, too, by the reduction in activation time, a longer off-time can be taken and accordingly power consumption can be reduced.

In addition, while in the amplifier circuit 300 according to the third embodiment shown in FIG. 4 five transistors 301, 303, 305, 307, and 309 are cascade-connected, the number of cascade-connected transistors in the present embodiment is four and thus the output amplitude range can be increased.

The boost amplifiers 412 and 413 according to the fourth embodiment are differential amplifiers. Thus, to set a correct common-mode voltage level of an output, it is preferred to use, for example, a common-mode feedback circuit. An example of the common-mode feedback circuit is shown in FIG. 6. FIG. 6 corresponds to a dashed-line portion in FIG. 5. Voltages Vc and Vb1 to be respectively provided to gate electrodes of transistors 420 and 434 are generated by a peripheral circuit (not shown).

Current sources 430 and 431 are connected between a power supply voltage Vdd and the gate electrodes of the transistors 403 and 404. A transistor 432 has a drain electrode connected to the gate electrode of the transistor 403 and a gate electrode connected to the source electrode of the transistor 403. A transistor 433 has a drain electrode connected to the gate electrode of the transistor 404 and a gate electrode connected to the source electrode of the transistor 404.

A power supply voltage Vdd is provided to a drain electrode of the transistor 420. A common source electrode of the transistors 420, 432, and 433 is connected to a drain electrode of the transistor 434. A source electrode of the transistor 434 is grounded.

In FIG. 6, a common-mode feedback circuit is implemented by a single transistor 420. In such a common-mode feedback circuit, the power consumption increases by an amount corresponding to the current flowing through the transistor 420.

Thus, it is more preferred to use a switched capacitor common-mode feedback circuit in which the power consumption does not increase. FIG. 7 shows an example of a circuit configuration for when a differential amplifier including a switched capacitor common-mode feedback circuit is applied to the boost amplifier 412. The same components as those in FIG. 6 are denoted by the same reference numerals.

The switched capacitor common-mode feedback circuit includes two capacitors Cc1 and Cc2 having an equal capacitance value and connected in series between outputs (between a gate electrode of a transistor 403 and a gate electrode of a transistor 404). Whether to apply bias voltages Vbp and Vb1 for resetting charges in the capacitors Cc1 and Cc2 is switched by switches SW43, SW44, and SW48. The switch SW48 is on/off controlled by a switching control signal CS42. An average value of change in output is detected from a node Vz which is a connection point between the capacitors Cc1 and Cc2, and is fed back to a transistor 434 serving as a current source.

In the switched capacitor common-mode feedback circuit, to set (reset) an initial value for charges in the capacitors Cc1 and Cc2, a period during which appropriate bias voltages (Vbp and Vb1) are provided to both electrodes of each of the capacitors Cc1 and Cc2 needs to be provided periodically. Therefore, a mechanism (the switches SW43 and SW44 and the bias voltage Vbp) for providing a bias voltage to output nodes of a boost amplifier is partially shared with a mechanism for resetting the common-mode feedback circuit. Accordingly, in implementing such a configuration, an increase in circuit area can be suppressed.

On/off switching of the boost amplifiers 412 and 413 may be performed simultaneously with the amplifier circuit 400 to further reduce the power consumption. When on/off switching is performed in the configuration of the boost amplifier shown in FIG. 7, a circuit configuration such as that shown in FIG. 8 is used.

A gate electrode of the transistor 434 and the node Vz are connected to a ground potential through a switch SW49. The switch SW49 is on/off controlled by a switching control signal CS41. By this, the boost amplifier can also perform on/off switching simultaneously with the amplifier circuit 400. In such a configuration, too, by applying a bias voltage to output nodes upon rising a boost amplifier, to forcefully rise a boost amplifier, the activation time can be reduced.

The configurations shown in FIGS. 6 to 8 can also be applied to the boost amplifier 413. In such a case, the polarities of transistors composing the boost amplifier 413 differ from those of transistors composing the boost amplifier 412.

Fifth Embodiment

A schematic configuration of an amplifier circuit 500 according to a fifth embodiment of the present invention is shown in FIG. 9. The amplifier circuit 500 is a switched capacitor amplifier circuit that includes a switched operational amplifier SO, capacitors C1 and C2, and switches SW51 to SW56.

An input signal Vin is provided to respective one ends of the capacitors C1 and C2 through the switches SW51 and SW52, respectively. The one end of the capacitor C1 is connected to a ground potential Vss through the switch SW55 and the other end of the capacitor Cl, together with the other end of the capacitor C2, is connected to an input terminal of the switched operational amplifier SO. Also, the other end of the capacitor C1 and the other end of the capacitor C2 are connected to a ground potential Vss through the switch SW53.

The one end of the capacitor C2 is connected to an output terminal of the switched operational amplifier SO through the switch SW56. The output terminal of the switched operational amplifier SO is connected to a power supply voltage Vdd through the switch SW54.

The switched operational amplifier SO is configured by any of the amplifier circuits 100 to 400 according to the first to fourth embodiments. For example, when the switched operational amplifier SO is configured by the amplifier circuit 300, a switch SW57 shown in FIG. 9 corresponds to the switches SW33 to SW36 in FIG. 4 and serves to switch whether to provide bias voltages Vbn and Vbp to boost amplifiers. A switch SW58 corresponds to the switch SW37 and serves to switch on and off the switched operational amplifier SO. The switches SW51 to SW54 are on/off controlled by a switching control signal CS51. The switches SW55 and SW56 are on/off controlled by a switching control signal CS52. The switching control signal CS52 takes a value obtained by inverting the switching control signal CS51.

The switch SW57 is on/off controlled by a switching control signal CS53. The switch SW58 is on/off controlled by a switching control signal CS54.

Figure 10:
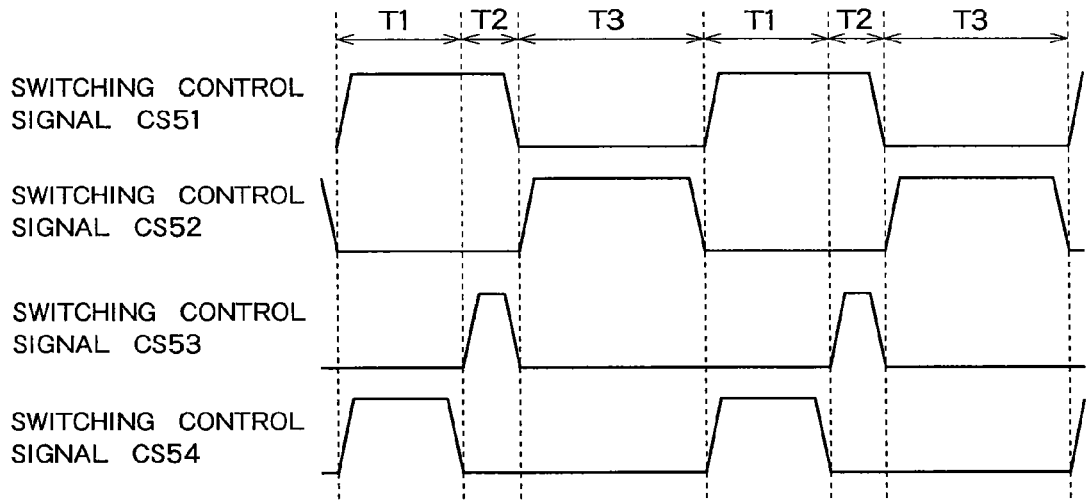
FIG. 10 is a timing chart of switching control signals for switches in the amplifier circuit according to the fifth embodiment.

The operation of such an amplifier circuit 500 will be described using a timing chart of the switching control signals CS51 to CS54 shown in FIG. 10. Note that the switching control signals CS51 to CS54 are generated by a peripheral circuit or the like (not shown). Periods T1 and T2 correspond to a sample mode of the switched capacitor amplifier circuit and a period T3 corresponds to an amplifier mode.

During the period T1, the switching control signal CS51 is at a high level and the switching control signal CS52 is at a low level and accordingly the switches SW51 to SW54 are turned on and the switches SW55 and SW56 are turned off. By this, an input signal Vin is sampled by the capacitors C1 and C2.

At this time, the switching control signal CS54 is at a high level and accordingly the switch SW58 is turned on and the switched operational amplifier SO is turned off. Since the switched operational amplifier SO is not used during a sample mode, there is no problem with the switched operational amplifier SO being turned off.

During the period T2, the switching control signal CS54 goes to a low level and accordingly the switch SW58 is turned off and the switched operational amplifier SO is turned on. The switching control signal CS53 goes to a high level and accordingly the switch SW57 is turned on and bias voltages Vbn and Vbp are provided to output nodes of boost amplifiers in the switched operational amplifier SO. By this, the boost amplifiers are forcefully caused to rise and accordingly the activation time of the switched operational amplifier SO is reduced.

During the period T3, the switching control signal CS53 goes to a low level and accordingly the switch SW57 is turned off. Hence, the output nodes of the boost amplifiers in the switched operational amplifier SO are separated from the bias voltages Vbn and Vbp, whereby the output impedance of the switched operational amplifier SO increases.

The switching control signal CS51 goes to a low level and the switching control signal CS52 goes to a high level and accordingly the switches SW51 to SW54 are turned off and the switches SW55 and SW56 are turned on. By this, a signal Vout which is obtained by amplifying the input signal Vin is output.

As such, in the present embodiment, since the activation time of the switched operational amplifier SO can be reduced, the switched operational amplifier SO can be turned off almost all the time (period T1) during a sample mode and thus the power consumption can be reduced. In addition, since the activation time is short, an increase in speed can be supported. Note that although FIG. 9 shows the case in which the amplifier circuit 500 is a single phase, the amplifier circuit 500 may have a differential configuration.

Sixth Embodiment

A schematic configuration of an A/D converter 600 according to a sixth embodiment of the present invention is shown in FIG. 11. The A/D converter 600 is a pipeline A/D converter having two operating modes including a sample mode and an amplifier mode.

The A/D converter 600 includes a sample-and-hold circuit 601, a plurality of cascade-connected stages 602, and a digital correction circuit 605. The sample-and-hold circuit 601 samples and holds an analog input signal. Output digital signals from the respective stages 602 are input to the digital correction circuit 605 and the digital correction circuit 605 generates a final digital output signal.

Each stage 602 has a comparator 603 and a D/A converter (MDAC: Multiplying Digital-to-Analog Converter) 604. The comparator 603 of each stage 602 A/D converts a high-order bit of an input signal and outputs an A/D conversion result to the digital correction circuit 605. Also, the D/A converter 604 D/A converts digital data about the A/D conversion result and subtracts the D/A converted data from an original value (input signal). The subtraction result (analog value) is output to a subsequent stage 602.

A switched capacitor amplifier such as that shown in FIG. 9 is used in each D/A converter 604. By this, a switched operational amplifier in the switched capacitor amplifier can be turned off almost all the time during a sample mode and accordingly the power consumption of the pipeline A/D converter can be reduced.

The present embodiment can also be applied to other A/D converters having two operating modes including a sample mode and an amplifier mode, than pipeline A/D converters.

The amplifier circuits described in the above-described embodiments may be appropriately configured in a reversed polarity version.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An amplifier circuit that amplifies an input signal and outputs the amplified signal from an output node, the amplifier circuit comprising:
    a current source that is connected between a first reference voltage line and the output node, and that generates a constant current when a switching control signal takes a first value, and does not generate the constant current when the switching control signal takes a second value;
    a voltage control current source which is connected to a second reference voltage line, and whose amount of current is controlled by the input signal;
    a cascode transistor that outputs the amplified signal, and that has a drain electrode and a source electrode, the drain electrode being connected to the current source and the output node and the source electrode being connected to the voltage control current source;
    a boost amplifier that has an input terminal and an output terminal, the input terminal being connected to the source electrode of the cascode transistor and the output terminal being connected to a gate electrode of the cascode transistor;
    a first switch that is connected between the output node and the second reference voltage line, and that is turned off when the switching control signal takes the first value and is turned on when the switching control signal takes the second value; and
    a second switch that is connected between the output terminal of the boost amplifier and a voltage line having a predetermined voltage, and that is turned on for a predetermined period of time when a value of the switching control signal is switched from the second value to the first value and is turned off after the predetermined period of time has elapsed.

2. The amplifier circuit according to claim 1, wherein the predetermined voltage is a voltage at an operating point of the boost amplifier.

3. The amplifier circuit according to claim 1, further comprising:
    a second cascode that has a source electrode and a drain electrode, the source electrode being connected to the current source and the drain electrode being connected to the output node, and that has a different polarity from the cascode transistor;
    a second boost amplifier that has a second input terminal and a second output terminal, the second input terminal being connected to the source electrode of the second cascode transistor and the second output terminal being connected to a gate electrode of the second cascode transistor; and
    a third switch that is connected between the second output terminal and a second voltage line having a second predetermined voltage, and that is turned on for the predetermined period of time when the value of the switching control signal is switched from the second value to the first value and is turned off after the predetermined period of time has elapsed.

4. The amplifier circuit according to claim 3, wherein the second predetermined voltage is a voltage at an operating point of the second boost amplifier.

5. The amplifier circuit according to claim 1, wherein the input signal is differential signals and the amplifier circuit has a differential configuration in which amplified differential signals are output from the output node.

6. An amplifier circuit that amplifies differential input signals and outputs the amplified differential signals from a first and a second output node, respectively, the amplifier circuit comprising:
    a transistor differential pair having gate electrodes to which the differential input signals are respectively provided;
    a first cascode stage that is connected between a first reference voltage line and the first and the second output node, includes a first boost amplifier, and uses conductive transistors that are different from the transistor differential pair;
    a second cascode stage that is connected between a second reference voltage line and the first and the second output node, includes a second boost amplifier, and uses conductive transistors that are same as the transistor differential pair;
    a current source transistor that is connected between a common source electrode of the transistor differential pair and the second reference voltage line, and that is turned on and operates as a current source when a switching control signal takes a first value and is turned off when the switching control signal takes a second value;
    a first switch that is connected between the first output node and the first reference voltage line, and that is turned off when the switching control signal takes the first value and is turned on when the switching control signal takes the second value;
    a second switch that is connected between the second output node and the first reference voltage line, and that is turned off when the switching control signal takes the first value and is turned on when the switching control signal takes the second value;
    a third switch that is connected between an output terminal of the first boost amplifier and a first voltage line having a first predetermined voltage, and that is turned on for a predetermined period of time when a value of the switching control signal is switched from the second value to the first value and is turned off after the predetermined period of time has elapsed; and a fourth switch that is connected between an output terminal of the second boost amplifier and a second voltage line having a second predetermined voltage, and that is turned on for a predetermined period of time when the value of the switching control signal is switched from the second value to the first value and is turned off after the predetermined period of time has elapsed.

7. The amplifier circuit according to claim 6, wherein the first cascode stage has two pairs of cascode-connected first transistors, the second cascode stage has a pair of cascode-connected second transistors, and the amplifier circuit is of a telescopic type in which drain electrodes of the transistor differential pair are connected to source electrodes of the second transistors.

8. The amplifier circuit according to claim 6, wherein the first cascode stage has two pairs of cascode-connected first transistors, the second cascode stage has two pairs of cascode-connected second transistors, and the amplifier circuit is of a folded-cascode type in which drain electrodes of the transistor differential pair are connected to the first cascode stage.

9. The amplifier circuit according to claim 6, wherein the first boost amplifier and the second boost amplifier are turned on when the value of the switching control signal is the first value and is turned off when the value of the switching control signal is the second value.

10. The amplifier circuit according to claim 6, wherein the first boost amplifier and the second boost amplifier have a differential configuration including a common-mode feedback circuit.

11. The amplifier circuit according to claim 10, wherein the common-mode feedback circuit is of a switched capacitor type that has two capacitors having an equal capacitance value and connected in series between differential outputs.

12. The amplifier circuit according to claim 11, further comprising a fifth switch that is connected between a connection point between the two capacitors and the second reference voltage line, and that is turned on and off at same timing as the first and the second switch.

13. The amplifier circuit according to claim 1, further comprising a capacitor and a switch that perform sampling of the input signal provided to the voltage control current source.

14. The amplifier circuit according to claim 13, wherein the capacitor and the switch perform the sampling of the input signal when the switching control signal has the second value and during the predetermined period of time after the switching control signal is switched from the second value to the first value.

15. An A/D converter comprising an amplifier circuit according to claim 13, wherein the A/D converter has two operation modes including a sample mode and an amplifier mode.

16. The A/D converter according to claim 15, further comprising:

a sample-and-hold circuit that samples an analog input signal during the sample mode and holds the analog input signal during the amplifier mode;

a plurality of stages that are cascade connected on an output side of the sample-and-hold circuit, each stage including a comparator that converts a first analog signal to be input into a digital signal and outputs the digital signal; and a digital-to-analog converter including the amplifier circuit that converts the digital signal into a second analog signal and outputs a difference signal between the first and the second analog signal; and a digital correction circuit that combines digital signals output from the respective stages to generate a digital output signal.

* * * * *